United States Patent
Hanafi et al.

[11] Patent Number: 6,093,947
[45] Date of Patent: Jul. 25, 2000

[54] RECESSED-GATE MOSFET WITH OUT-DIFFUSED SOURCE/DRAIN EXTENSION

[75] Inventors: Hussein Ibrahim Hanafi, Basking Ridge, N.J.; Young Hoon Lee, Somers; Hsingjen Wann, Briarcliff Manor, both of N.Y.

[73] Assignee: International Business Machines Corporation, Armonk, N.Y.

[21] Appl. No.: 09/136,324

[22] Filed: Aug. 19, 1998

[51] Int. Cl.$^7$ .................................................. H01L 29/76
[52] U.S. Cl. ........................... 257/330; 257/333; 257/334
[58] Field of Search .................................... 257/330, 334, 257/333; 438/259

[56] References Cited

U.S. PATENT DOCUMENTS

| | | | |
|---|---|---|---|
| 5,472,897 | 12/1995 | Hsu et al. ................................ | 438/291 |
| 5,489,792 | 2/1996 | Hu et al. . | |
| 5,599,728 | 2/1997 | Hu et al. . | |
| 5,747,373 | 5/1998 | Yu ............................................ | 438/305 |
| 5,780,340 | 7/1998 | Gardner et al. .......................... | 438/259 |

*Primary Examiner*—Tom Thomas
*Assistant Examiner*—Thien F Tran
*Attorney, Agent, or Firm*—Scully, Scott, Murphy & Presser; Manny W. Schecter

[57] ABSTRACT

The present invention relates to a recessed channel/gate MOSFET structure which comprises a semiconductor wafer having a plurality of shallow trench isolation regions embedded therein, wherein between each adjacent shallow trench isolation region is a field effect transistor region which comprises a source and drain region which are spaced apart by a gate region, said gate region comprising a poly gate region which is positioned between oxide spacers, said poly gate region having a metal contact region on its top surface and a gate oxide region on its bottom surface embedded in said semiconductor wafer and wherein said source and drain regions have an extension which wraps around said oxide spacers and provides a connection with a channel region which is formed below said gate oxide region.

8 Claims, 6 Drawing Sheets

RECESSED-GATE MOSFET WITH OUT-DIFFUSED SOURCE/DRAIN EXTENSION

FIELD OF THE INVENTION

The present invention relates to a metal oxide semiconductor field effect transistor (MOSFET) which contains a recessed channel/gate and a buried source/drain extension which provides a connection between the source/drain regions and an adjacent gate channel region. The present invention is also directed to a self-aligned process of fabricating such a MOSFET having a complete connection from the source through the channel and to the drain.

BACKGROUND OF THE INVENTION

In current complementary metal oxide semiconductor (CMOS) technology, MOSFET devices having a minimum effective gate length of about 0.25 $\mu$m atop a 5 nm thin gate oxide with a 100 nm deep source/drain junction can be fabricated. Future generations of CMOS technology will ultimately require sub-0.1 $\mu$m gate lengths and a source/drain junction depth of less than 20 nm in order to obtain faster switching speeds and denser packing requirements while avoiding short channel effects. Attempts to extend present CMOS technology to achieve these objectives have been unsatisfactory largely due to the difficulty in forming a shallow junction with a steep dopant profile having a three or four decade change in concentration over a short distance of 2–3 nm. Another problem is the consumption of silicon (Si) which occurs during silicidation for source/drain contacts. This Si consumption typically occurs when the junction is too shallow.

One alternative MOSFET structure to solve these problems is a raised source/drain MOSFET structure which requires a selective epitaxial Si growth to form the source and drain regions. To grow high quality single crystalline Si, the prior art Si epi-processes utilize a high temperature (greater than 900° C.) pre-cleaning step wherein the dopant species moves. This movement of dopant species within the structure influences the critical dopant profile.

Another alternative structure employed in the prior art to avoid the above drawbacks is a recessed channel/gate MOSFET, in which the recessed channel is defined by thermal oxidation. The use of thermal oxidation creates a bird-beak as well as leading to difficulties in controlling the critical dimension of the channel.

In order to succeed at sub-0.1 $\mu$m gate dimensions and below it will be necessary to develop new CMOS technology that circumvents all of the problems mentioned hereinabove.

SUMMARY OF THE INVENTION

One object of the present invention is to provide a recessed channel/gate MOSFET structure having a gate dimension of 0.1 $\mu$m or less.

Another object of the present invention is to provide a recessed channel/gate MOSFET structure wherein a complete connection from the source region through the channel and to the drain region is achieved.

A still further object of the present invention is to provide a recessed channel/gate MOSFET structure in which a thin gate oxide is located deep inside the semiconductor wafer, while the source/drain regions maintain a thicker junction near the semiconductor surface.

These and other objects and advantages are achieved in the present invention by providing a recessed channel/gate MOSFET structure wherein said MOSFET structure contains a recessed channel/gate and a buried extension which provides a connection between the source/drain regions and the gate channel. Specifically, the MOSFET structure of the present invention comprises a semiconductor wafer having a plurality of shallow trench isolation regions embedded therein, wherein between each adjacent shallow trench isolation region is a field effect transistor region which comprises a source and drain region which are spaced apart by a gate region, said gate region comprising a poly gate region which is positioned between oxide spacers, said poly gate region having a metal contact region on its top surface and a gate oxide region on its bottom surface embedded in said semiconductor wafer and wherein said source and drain regions have an extension which wraps around said oxide spacers and provides a connection to a gate channel which is located beneath the gate oxide region. The structure of the present invention further comprises nitride double spacers and metal contacts that are formed over portions of the source/drain regions. The nitride double spacers are formed over pad oxide regions.

Another aspect of the present invention relates to various processes that can be employed in the present invention in fabricating the above-mentioned MOSFET structure. In one process of the present invention, a dopant sidewall spacer is employed as the oxide spacer and a subsequent annealing step is utilized to effectuate out-diffusion of the dopant material into the semiconductor wafer. The out-diffused material forms the extension or junction which wraps around the oxide spacers. Specifically, this process of the present invention comprises the steps of:

(a) providing a structure comprising a semiconductor wafer having a pad oxide layer on one of its surfaces and a dielectric layer on top of said pad oxide layer;

(b) forming a hole in said structure extending into said semiconductor wafer, said hole having sidewalls and a bottom wall;

(c) forming oxide spacer regions on said sidewalls of said hole wherein said oxide spacers contain a dopant material which can out-diffuse when subjected to annealing;

(d) growing a gate oxide region on said bottom wall of said hole;

(e) forming a conformal layer of polysilicon in said hole and on said dielectric layer;

(f) polishing the structure provided in step (e);

(g) removing said dielectric layer exposing said pad oxide layer and outer walls of said oxide spacer regions;

(h) forming source/drain regions in said semiconductor wafer adjacent to said hole; and (i) annealing said structure to cause out-diffusion of said dopant from said oxide spacer region to said semiconductor wafer so as to form an extension which wraps around said oxide spacer regions and provides a connection to a channel region which is located beneath said gate oxide region.

In another process of the present invention, no dopant material is used in forming the oxide spacers thus no annealing step is necessary. Instead the extension or junction is formed by careful hole formation. Specifically, this embodiment of the present invention comprises the steps of:

(a) providing a structure comprising a semiconductor wafer having a pad oxide layer on one of its surfaces and a dielectric layer on top of said pad oxide layer, wherein said semiconductor wafer contains source regions and drain regions which are spaced apart and are positioned between opposing shallow trench isolation regions;

(b) forming a hole in said structure between said spaced apart source/drain regions such that said hole extends into a portion of said source/drain regions but not entirely therethrough, said hole having sidewalls and a bottom wall;

(c) forming oxide spacer regions on said sidewalls of said hole;

(d) growing a gate oxide region on said bottom wall of said hole;

(e) forming a conformal layer of polysilicon in said hole and on said dielectric layer;

(f) polishing said structure provided in step (e);

(g) removing said dielectric layer and a portion of said pad oxide layer; and (h) forming nitride double spacers on said remaining pad oxide layer.

DETAILED DESCRIPTION OF THE INVENTION

Figure 1:
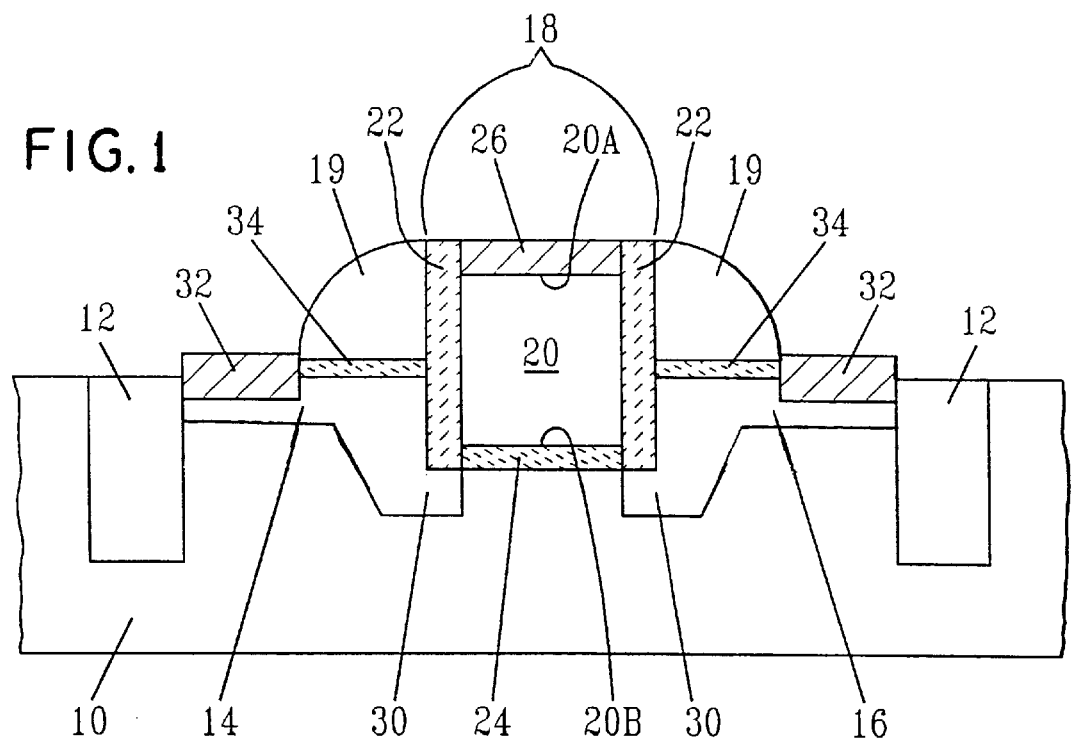
FIG. 1 is a cross-sectional view of a MOSFET structure prepared in accordance with a first embodiment of the present invention.

The present invention, which is directed to a recessed channel/gate MOSFET having an extension or junction beneath oxide spacers, will now be described in greater detail by referring to the drawings that accompanying this application. It should be noted that in the drawings like elements or corresponding components are referred to by like and corresponding reference numerals.

Figure 2:
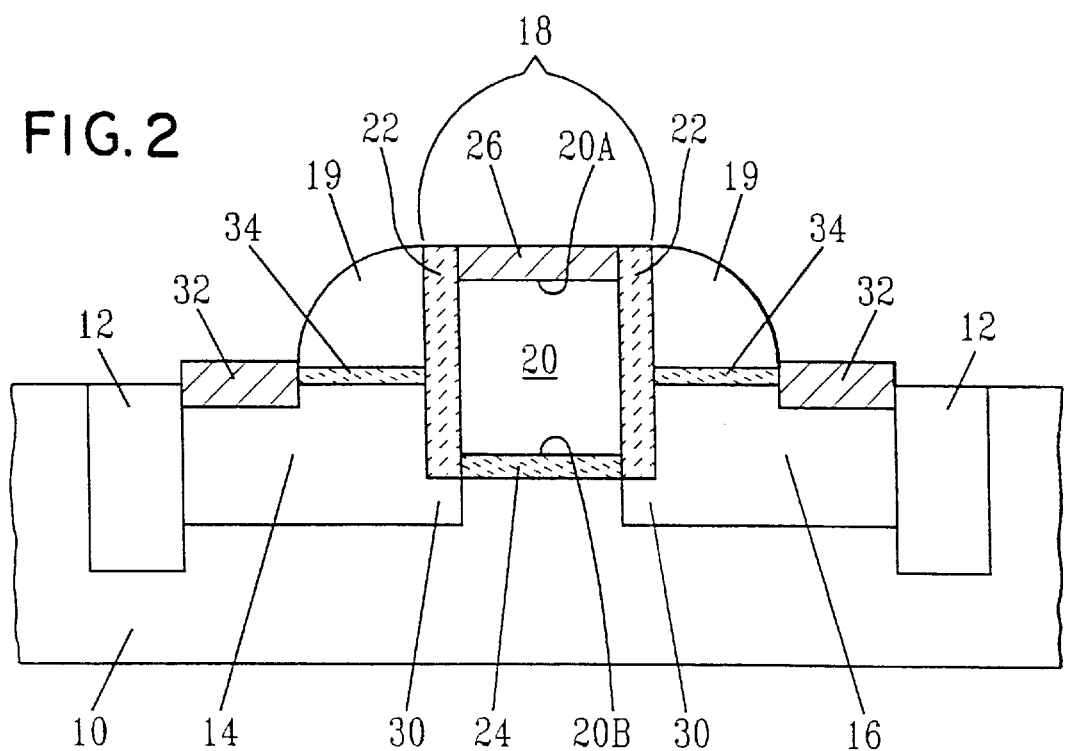
FIG. 2 is a cross-sectional view of a MOSFET structure prepared in accordance with a second embodiment of the present invention.

Reference is first made to FIGS. 1 and 2 which are illustrations (cross-sectional views) of two MOSFET structures of the present invention. Specifically, the MOSFET devices shown in FIGS. 1 and 2 comprise a semiconductor substrate or wafer 10 which contains a plurality, in the present cases only two are depicted, of shallow trench isolation regions (STI) 12 which are formed in semiconductor substrate or wafer 10 utilizing conventional techniques well known to those skilled in the art. Between each adjacent shallow trench isolation region 12 is a source region 14 and a drain region 16 which are spaced apart by region 18 which is a gate/channel area of a corresponding field effect transistor. Gate/channel region 18 comprises a poly gate region 20 which is positioned between oxide spacers 22. Outer nitride double spacers 19 are located adjacent to oxide spacers 22 and are located atop the source/drain regions and over pad oxide layer 34. Poly gate region 20 includes a metal contact region 26 on its top surface 20A and a gate oxide region 24 on its bottom surface 20B embedded in semiconductor substrate or wafer 10. A channel region, not show in the drawings, is located beneath the gate oxide region. The source and drain regions contain region 30 which forms an extension or junction that wraps around oxide spacers 22 and provides a connection with the gate channel. The MOSFET structures of the present invention further comprise metal contacts 32 that are formed over the source/drain regions.

The process that can be used in forming the MOSFET structure shown in FIG. 1 will now be discussed in greater detail. Specifically, the process of the present invention which utilizes an oxide sidewall spacer containing a dopant material and a subsequent annealing step will be first described followed by a detailed description of another process that can be used in forming the structure shown in FIG. 2. The alternative process does not include the use of a dopant oxide sidewall spacer thus no annealing step is employed.

Figure 3A:
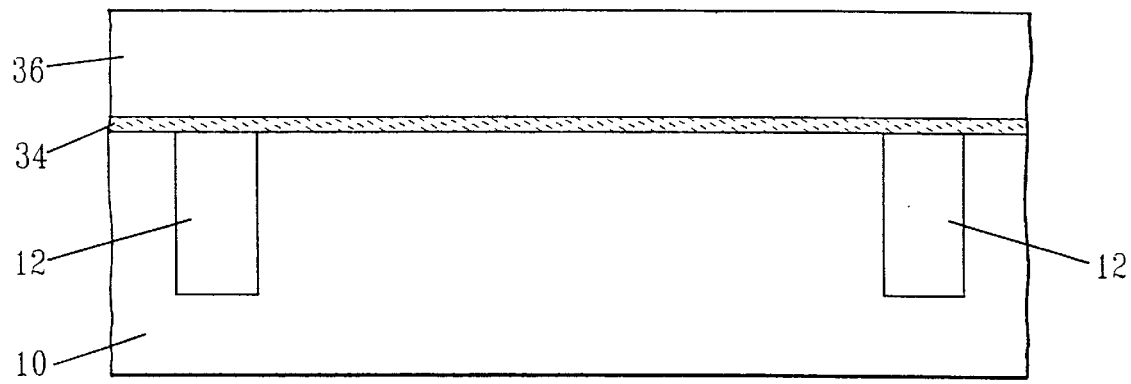
FIGS. 3(a)–(f) are cross-sectional views showing the structure of FIG. 1 during different processing steps of the present invention.

Turning to the first process of the present invention, that process, as stated above, employs the use of an oxide sidewall spacer which contains a dopant material and a subsequent annealing step. Reference is made to FIGS. 3(a) which shows the initial structure that is employed in the present invention for forming the MOSFET structure shown in FIG. 1. Specifically, FIG. 3(a) illustrates a structure which comprises a semiconductor wafer or substrate 10 which contains a pad oxide layer 34 on one of its surfaces and a dielectric layer 36 formed over pad oxide layer 34. Semiconductor wafer or substrate 10 contains a plurality of shallow trench isolation (STI) regions 12 which are fabricated utilizing conventional STI processing techniques well known to those skilled in the art.

Suitable semiconductor wafers or substrates that can be employed in the present invention are any semiconducting material including, but not limited to: silicon (Si), Ge, SiGe, GaAs, InAs, InP and all other III/V compounds. Of these semiconductor materials, it is highly preferred that semiconductor wafer or substrate 10 be composed of Si.

Pad oxide layer 34 and dielectric layer 36 are formed utilizing conventional deposition processes well known in the art. For example, chemical vapor deposition, plasma enhanced chemical vapor deposition, sputtering, plating and other like deposition processes may be employed in the present invention. While the thickness of each layer is not critical to the present invention, it is preferred that pad oxide layer 34 has a thickness of from about 8 to about 14 nm and that dielectric layer 36 has a thickness of from about 100 to about 200 nm.

Pad oxide layer 34 may be composed of an oxide-containing material such as, but not limited to: $SiO_2$, $TiO_2$, $Ta_2O_5$ and other like oxide-containing metals which serve to facilitate any stresses which may occur when dielectric layer 36 is formed atop of semiconductor wafer or substrate 10.

Dielectric layer 36 may be composed of any conventional dielectric material including, but not limited to: $SiO_2$, $Si_3N_4$, polyimides, diamond, diamond-like carbon, silicon polymers, paralyne polymers and fluorinated diamond-like carbon. Of these dielectrics, it is preferred that layer 36 be composed of $Si_3N_4$.

The structure shown in FIG. 3(a) may be subjected to a planarization process prior to forming a hole between two adjacent STI regions. Any planarization processes known to those skilled in the art, such as reactive ion etching (RIE), chemical-mechanical polishing (CMP) and grinding may be employed in the present invention.

Figure 3B:
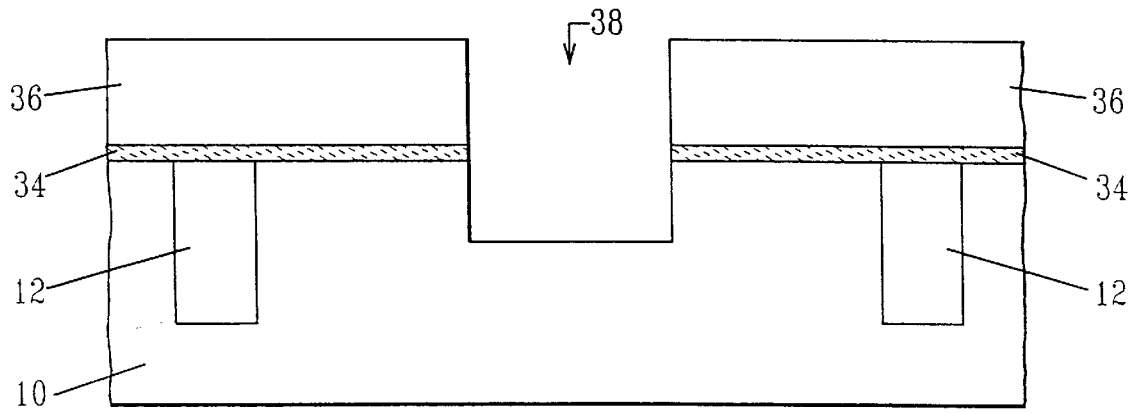

The next step of the present invention, which is illustrated in FIG. 3(b), comprises forming a hole 38 in the structure such that said hole extends down into semiconductor wafer or substrate 10 and is formed between the two adjacent STI regions 12. Hole 38 can be fabricated utilizing conventional lithography and anisotropic etching techniques such as reactive ion etching (RIE) or plasma etching. Other processes can also be utilized in the present invention in forming hole 38 as long as they cause substantially no damage to the semiconductor wafer. Although the exact depth is not critical to the present invention, etching may be carried out into the semiconductor wafer until a depth of from about 150 to about 300 nm is obtained.

Figure 3C:
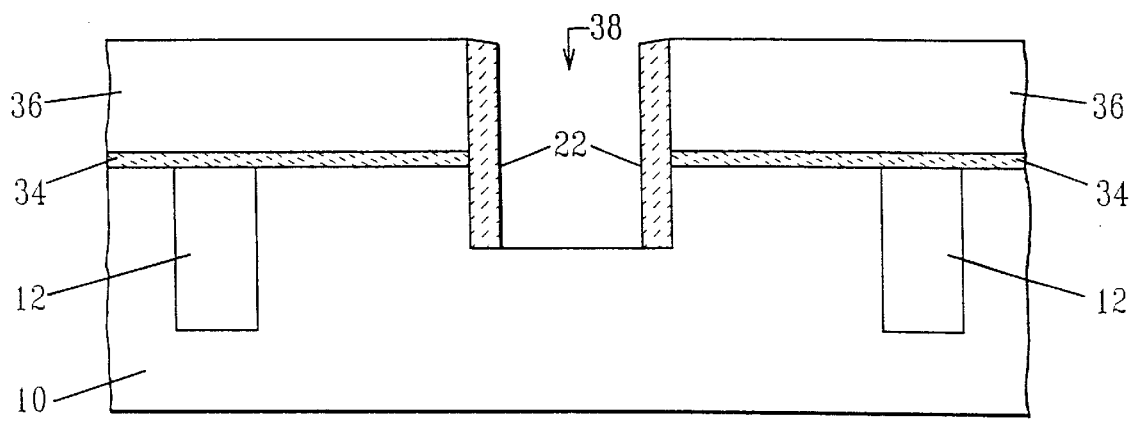

After forming hole 38 in the structure, an oxide spacer material 22 containing a dopant source material is formed on the sidewalls of hole 38 utilizing conventional deposition processes such as chemical vapor deposition, spin-on coating, dip coating, plasma vapor deposition and like deposition techniques. To ensure sidewall coverage, a directional RIE step may be employed in the present invention. Other processes can also be used as long as they again cause no substantial damage to the semiconductor wafer. The structure containing the oxide sidewall coverage is shown in FIG. 3(c).

Suitable materials used in forming oxide spacers 22 are materials which contain a dopant source. For example, boron silicate glass, arsenic silicate glass or phosphorus silicate glass may be employed since the dopant atoms, e.g. B, As, and P, can be out-diffused from the oxide spacer region into the silicon wafer by annealing.

Figure 3D:
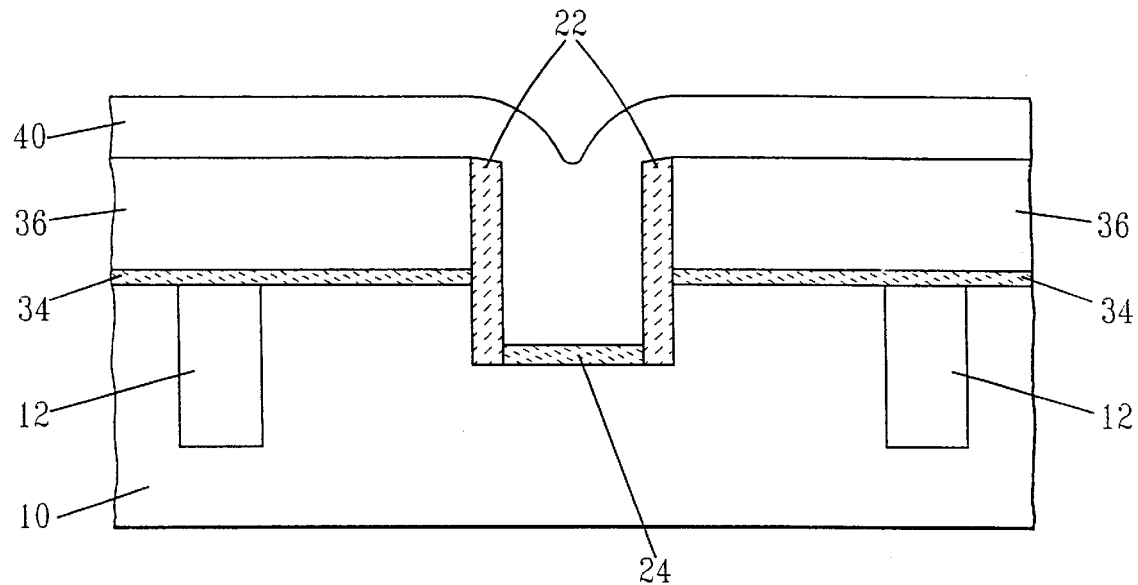

The next two steps of the present invention are illustrated in FIG. 3(d). Specifically, after forming oxide spacers 22 on the sidewalls of hole 38, a gate oxide region 24 is grown in the bottom of the hole utilizing an in-situ process which is capable of forming a thin gate oxide having a thickness of 2 nm or less. More preferably, the gate oxide region is grown to a thickness of from about 1 to about 3 nm.

Due to the relatively small gate oxide thickness required for sub 0.1 $\mu$m MOSFET's care should be taken in introducing contaminants into the gate oxide. Thus, prior art growth processes which require the use of different tools can not be employed in the present invention. Instead, the thin gate oxide region is formed as follows: First, the exposed semiconductor material in the hole is cleaned in a vacuum system. The cleaned structure is than transferred in a vacuum or in an inert ambient to an oxidation chamber and then the gate oxide is grown utilizing conditions well known to those skilled in the art. In the final stage, the wafer is transferred to another chamber which is capable of depositing a conformal layer of polysilicon 40 covering gate oxide 24, oxide spacers 22 and dielectric layer 36 before breaking the vacuum. The conformal layer of polysilicon 40 that is formed in the present invention has a thickness which ranges from about 100 to about 300 nm.

Figure 3E:
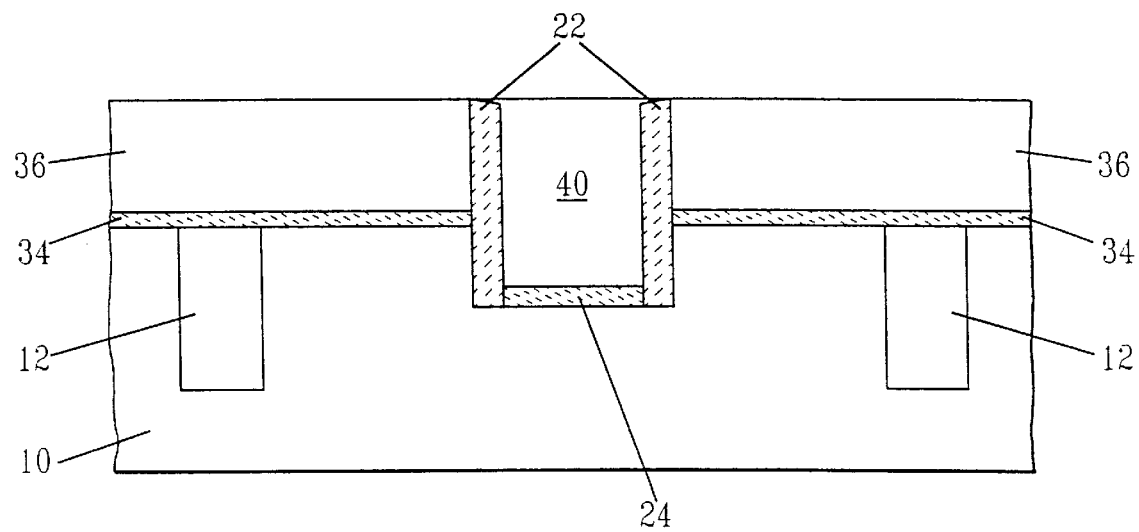

Next, the structure is planarized utilizing a conventional polishing technique such as chemical mechanical polishing so as to provide the planar structure shown in FIG. 3(e).

After planarization, dielectric layer 36 is removed utilizing a selective wet etch process such as a hot phosphoric etch and then source region 14 and drain region 16 are formed in semiconductor wafer or substrate 10 by ion implantation. Suitable ions used in forming source region 14 and drain region 16 are As, P (for NMOS) and B (for PMOS).

Figure 3F:
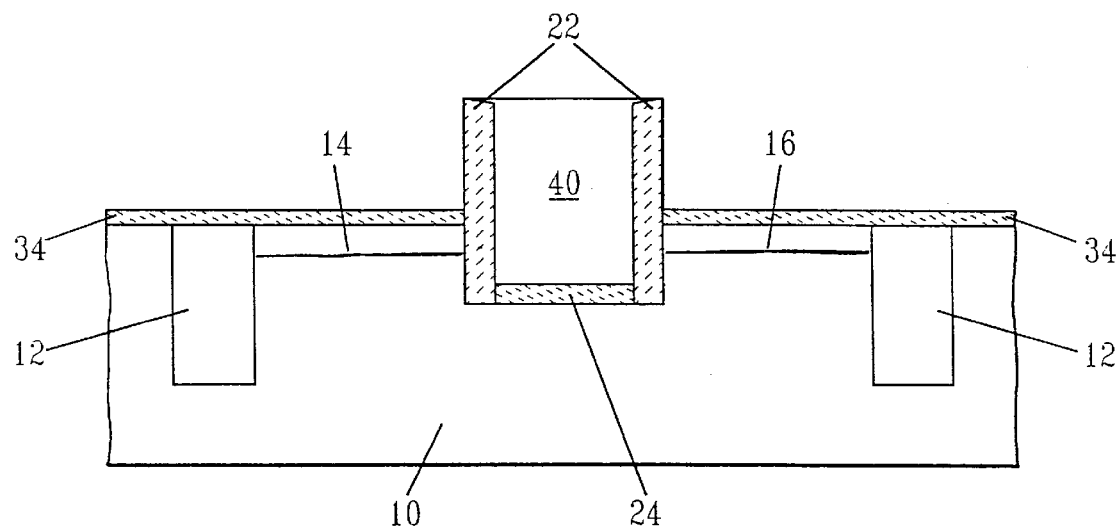

The wet etch process and ion implantation step are illustrated in FIG. 3(f). Ion implantation is carried out utilizing a conventional ion beam implantation apparatus that is capable of operating at an energy of from about 15 to about 25 KeV, and an ion dosage of from about $1 \times 10^{15}$ to about $1 \times 10^{16}$ atoms/cm$^2$. The ions can be implanted to a shallow depth of from about 100 to about 200 nm within semiconductor wafer or substrate 10.

After ion implantation, the structure is then subjected to annealing under conditions whereby the dopant within oxide spacers 22 is out-diffused from that region into semiconductor wafer or substrate 10 so as to form an extension on junction 30 which wraps around oxide spacers 22 and connects the source/drain regions to the channel which is located beneath gate oxide region 24. The structure is shown in FIG. 1.

Specifically, the annealing step is conducted in an inert gas atmosphere such as helium, nitrogen or argon at a temperature of from about 800° to about 1000° C. for a time period of from about 1 to about 10 seconds. Annealing may be conducted at a set temperature or it can be ramped up to a desired temperature utilizing a number of ramp cycles and soak cycles.

After annealing, nitride double spacers 19 are formed over pad oxide layers 34 by conventional deposition of a nitride-containing material, followed by a blanket RIE process. Suitable materials used in forming nitride double spacers include: TiN, $Si_3N_4$ and TaN. It is noted that in an alternative embodiment of the present invention, these steps may be performed prior to forming the source/drain regions.

In the next steps of the present invention, metal contacts, i.e. regions 32 and 26, are formed in the structure utilizing conventional processes such as lithography, etching and deposition (plating, chemical vapor deposition and other like deposition processes). Suitable materials used in forming metal contacts 32 and 26 include, but are not limited to: Al, Cu, W, Pt, Au, Pd and other like refractory metals. The final structure containing all the above mentioned components is illustrated in FIG. 1.

The other process that can be employed in the present invention in fabricating the recessed channel/gate MOSFET structure of FIG. 2 is shown in FIGS. 4(a)–(f). Specifically, in FIG. 4(a), there is shown the initial structure which can be used in this embodiment of the present invention. It is noted that FIG. 4(a) contains the same elements as shown in FIG. 3(a) except that the structure in FIG. 4(a) contains pre-implanted source and drain regions (14, 16) located between STI regions 12. The same ions and conditions used in forming the source and drain regions as described hereinabove can be employed in preparing the pre-implant structure.

Figure 4A:
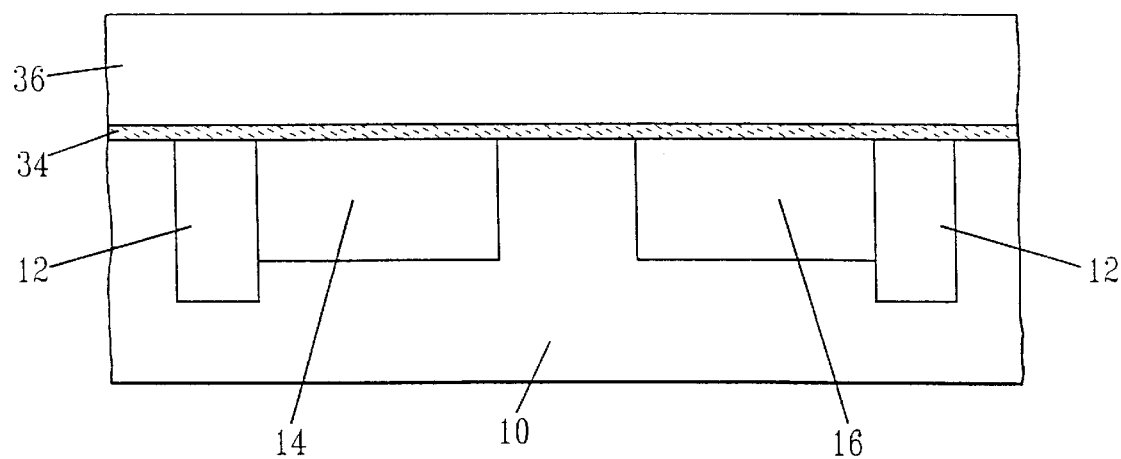
FIGS. 4(a)–(f) are cross-sectional views showing the structure of FIG. 2 during different processing steps of the present invention.
Figure 4B:
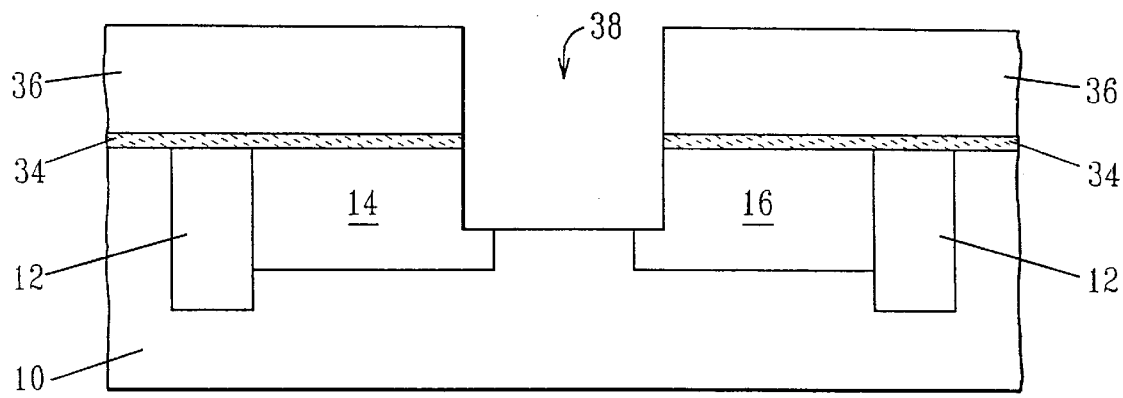

Next, a hole 38, as shown in FIG. 4(b), is formed in the structure between the spaced apart source drain regions such that hole 38 extends into a portion of said source/drain regions but not entirely therethrough. The conditions used in forming the hole shown in FIG. 3(b) can also be employed in this embodiment of the present invention.

Figure 4C:
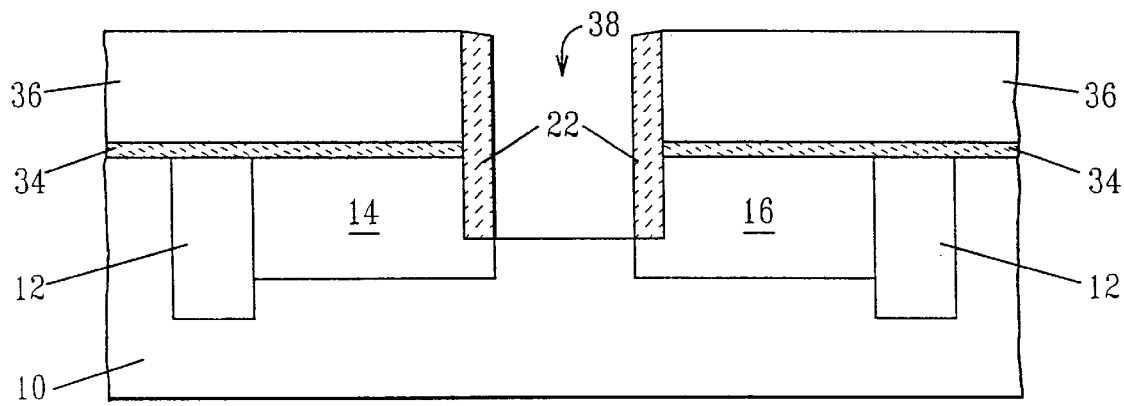

An oxide spacer region 22 is then formed on the sidewalls of the holes utilizing the conditions mentioned hereinabove, See FIG. 4(c). It is noted that in this embodiment of the present invention, the oxide spacer material does not need to contain a dopant atom; however oxide spacers containing a dopant atom are not excluded from being used. In this embodiment of the present invention, a low temperature oxide is employed as the oxide spacer material.

Figure 4D:
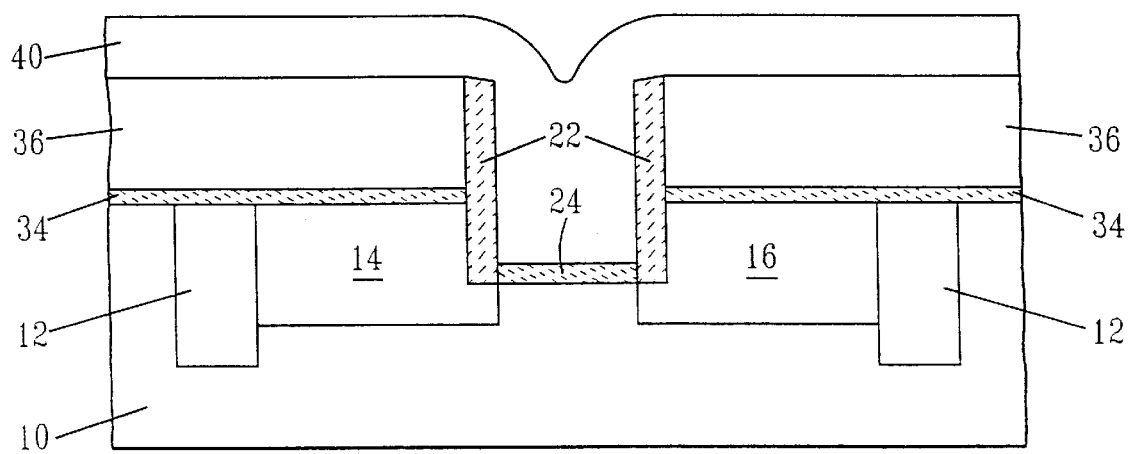

FIG. 4(d) illustrates the next steps of the present invention which comprise forming a gate oxide region 24 on said bottom wall of said hole and forming a conformal layer of polysilicon 40 in hole 38 and on dielectric layer 36. These steps of this embodiment of the present invention are the same as those mentioned above.

Figure 4E:
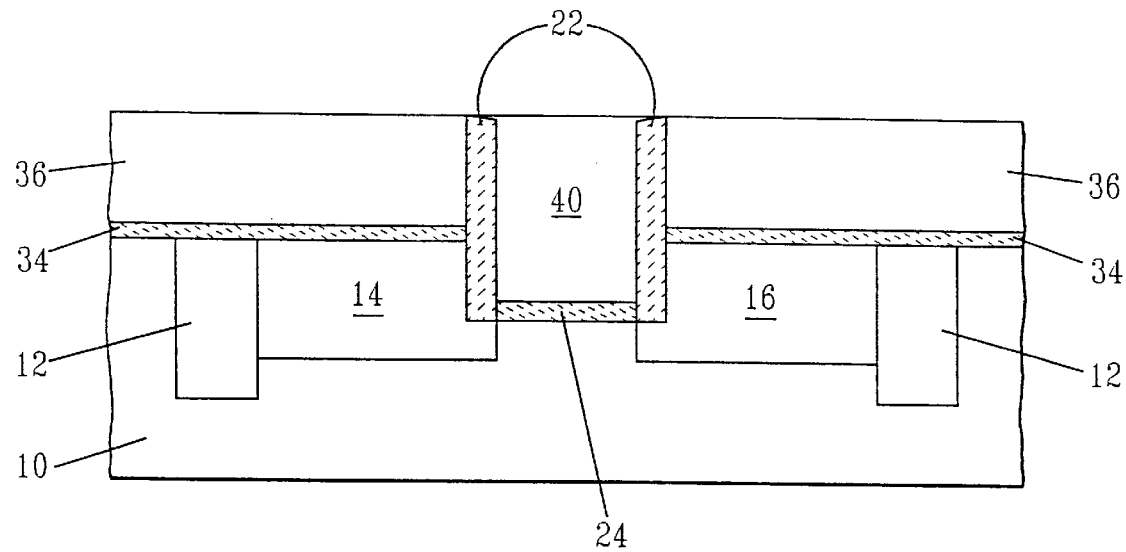
Figure 4F:
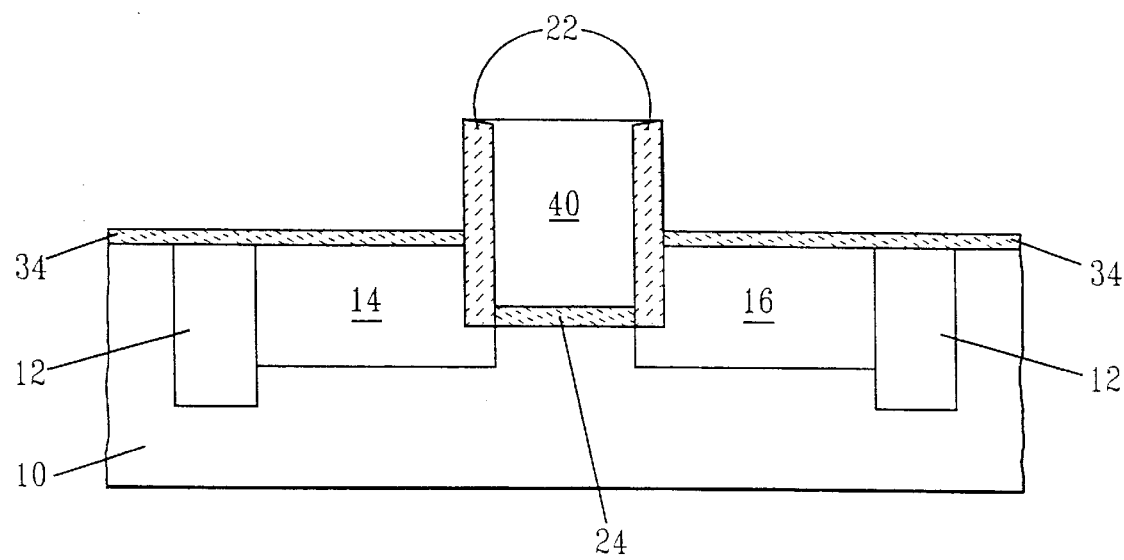

After gate oxide formation and polysilicon deposition, the structure shown in FIG. 4(d) is planarized to provide the structure shown in FIG. 4(e). Next, dielectric layer 40 is removed (See. FIG. 4(f)) and then pad oxide layer 34 is patterned and a portion thereof is removed. A nitride double spacer 19 is thereafter formed on the remaining pad oxide layer 34, See FIG. 2. These steps of this embodiment of the present invention are the same as those mentioned hereinabove in regards to FIGS. 3(*a*)–(*f*).

While this invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new, and desire to secure by the Letters Patent is:

1. A recessed channel/gate MOSFET structure comprising a semiconductor wafer having a plurality of shallow trench isolation regions embedded therein, wherein between each adjacent shallow trench isolation region is a field effect transistor region which comprises a source and drain region which are spaced apart by a gate/channel region having a length of 0.1 µm or less, said gate/channel region comprising a poly gate region which is positioned between oxide spacers, said poly gate region having a metal contact region on its top surface and a gate oxide region on its bottom surface embedded in said semiconductor wafer, said gate oxide having a thickness of 2 nm or less, and wherein said source and drain regions have an extension which wraps around said oxide spacers and provides a connection with a channel region underlying the gate oxide region.

2. The recessed channel/gate MOSFET structure of claim 1 wherein metal contacts are located on top of said source and said drain regions.

3. The recessed channel/gate MOSFET structure of claim 1 wherein nitride double spacers are formed over a portion of said source/drain regions containing a pattern pad oxide layer.

4. The recessed channel/gate MOSFET structure of claim 1 wherein said semiconductor wafer is a semiconducting material selected from the group consisting of Si, Ge, Ga, As, InAs, InP and other III/V compounds.

5. The recessed channel/gate MOSFET structure of claim 4 wherein said semiconductor wafer is Si.

6. The recessed channel/gate MOSFET structure of claim 1 wherein said metal contact region is composed of a metal selected from the group consisting of Al, Cu, W, Pt, Au and Pd.

7. The recessed channel/gate MOSFET structure of claim 3 wherein said nitride double spacers are composed of a material selected from the group consisting of TiN, TaN and $Si_3N_4$.

8. The recessed channel/gate MOSFET structure of claim 1 wherein said oxide spacer regions are composed of boron silicate glass, arsenic silicate glass or phosphorous silicate glass.

* * * * *